United States Patent
Suzuki et al.

(10) Patent No.: US 6,514,428 B2
(45) Date of Patent: Feb. 4, 2003

(54) ELECTROMAGNETIC WAVE ABSORBING, HEAT CONDUCTIVE SILICONE RUBBER COMPOSITIONS

(75) Inventors: Akio Suzuki, Gunma-ken (JP); Naoki Fuse, Nagoya (JP); Hiroshi Endo, Nagoya (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 09/832,039

(22) Filed: Apr. 11, 2001

(65) Prior Publication Data

US 2001/0051673 A1 Dec. 13, 2001

(30) Foreign Application Priority Data

Apr. 11, 2000 (JP) ........................ 2000-109249

(51) Int. Cl.$^7$ .............................. C09K 5/00; H01F 1/20; C09D 5/23; C08L 83/04; C08K 3/08
(52) U.S. Cl. ................ 252/74; 252/62.51 R; 252/62.55; 524/439; 524/440; 524/441; 524/442; 524/588
(58) Field of Search ................................. 524/439, 440, 524/441, 442, 588; 252/62.51 R, 62.55, 74; 165/185; 307/91; 361/816

(56) References Cited

U.S. PATENT DOCUMENTS

| 5,278,377 A | 1/1994 | Tsai |
| 5,366,664 A | 11/1994 | Varadan et al. |
| 6,040,362 A | 3/2000 | Mine et al. |

FOREIGN PATENT DOCUMENTS

| DE | 9756620 A1 | 6/1999 | |
| EP | 032050 | 7/1981 | |
| EP | 785557 A1 | 7/1997 | |
| EP | 0506272 A1 | 9/1999 | |
| JP | 07207160 A * | 8/1995 | ........... C08K/03/08 |
| JP | 11026977 | 1/1999 | |
| JP | 1335472 | 7/1999 | |
| JP | 11317591 A * | 11/1999 | ........... B32B/07/02 |
| JP | A11335472 | 12/1999 | |
| JP | 2000013083 | 1/2000 | |
| JP | 2000174480 A * | 6/2000 | ........... C08J/05/18 |
| JP | 2000232293 A * | 8/2000 | ........... H05K/09/00 |
| JP | 2001044687 A * | 2/2001 | ........... C08L/83/04 |
| WO | WO9808364 | 2/1998 | |

OTHER PUBLICATIONS

Smithells Metals Reference Book, seventh ed., 1992, Butterworth–Heinemann Ltd., pp. 10–41, 10–53.*

* cited by examiner

Primary Examiner—Robert Dawson
Assistant Examiner—Marc S Zimmer
(74) Attorney, Agent, or Firm—Birch, Stewart, Kolasch & Birch, LLP

(57) ABSTRACT

A silicone rubber composition loaded with a soft magnetic metal powder and optionally, a heat conductive filler and having in the cured state a thermal conductivity of at least 2.0 w/mK is suitable for forming heat dissipating sheets having both a heat transfer function and a noise attenuation function, which are effective for preventing malfunction of CPU.

14 Claims, 1 Drawing Sheet

ELECTROMAGNETIC WAVE ABSORBING, HEAT CONDUCTIVE SILICONE RUBBER COMPOSITIONS

FIELD OF THE INVENTION

This invention relates to electromagnetic wave absorbing, heat conductive silicone rubber compositions suitable for forming heat dissipating sheets disposed between electronic equipment components (such as Central Processing Unit ("CPU"), Microprocessing Unit ("MPU"), and Large Scale Integration ("LSI")) and heat sinks for conducting heat to the heat sinks while suppressing the noise originating from the electronic equipment components.

BACKGROUND ART

Since electronic equipment components such as CPU, MPU and LSI generate heat during operation, heat dissipating elements including heat dissipating media such as silicone grease and silicone rubber and metallic heat sinks are frequently used for cooling the electronic equipment components.

As the degree of integration of CPU is increased to meet the demand for size reduction, the amount of heat release per unit area is increased. Ineffective cooling will cause thermal runaway or undesired effects, giving rise to the problem of CPU malfunction. While it is desired to increase the operating frequency of CPU in order to meet the demand for high speed processing, a high frequency disturbance or noise is concomitantly produced which will join signals on communication lines, causing detrimental effects including malfunction.

One typical means for effectively radiating heat from CPU is to use heat dissipating media such as silicone grease and silicone rubber for effectively transferring heat from CPU to metallic heat sinks. This means, however, cannot avoid the problem of malfunction by noise because the silicone rubber and other heat dissipating media are not effective for absorbing electromagnetic waves or suppressing noise.

A noise suppression effect is achieved by adding ferrite materials such as Mn—Zn ferrite and Ni—Zn ferrite to silicone gel as disclosed in JP-A 11-335472. The noise which can be suppressed by this means is sometimes limited to the low frequency region. Problems of reliability and long-term storage stability arise since the ferrite materials are liable to rust.

SUMMARY OF THE INVENTION

An object of the invention is to provide an electromagnetic wave absorbing, heat conductive silicone rubber composition suitable for forming heat dissipating sheets having a heat dissipating function while exhibiting a noise suppression function over a wide frequency region from more than 10 MHz to less than 100 GHz, especially the quasi-microwave region.

It has been found that by incorporating in silicone rubber a soft magnetic metal powder, especially iron or an iron alloy, preferably in combination with a heat conductive filler (exclusive of the soft magnetic metal powder), there is obtained an electromagnetic wave absorbing, heat conductive silicone rubber composition suitable for forming heat dissipating sheets capable of simultaneously suppressing noise generation from electronic equipment components such as CPU, MPU and LSI, and transferring heat from the same.

The invention provides an electromagnetic wave absorbing, heat conductive silicone rubber composition comprising a soft magnetic metal powder and having in the cured state a thermal conductivity of at least 2.0 w/mK. The soft magnetic metal powder is typically selected from iron and iron alloys. The composition may further contain a heat conductive filler.

BRIEF DESCRIPTION OF THE DRAWING

The only FIGURE.

DESCRIPTION OF THE PREFERRED EMBODIMENT

Figure 1:
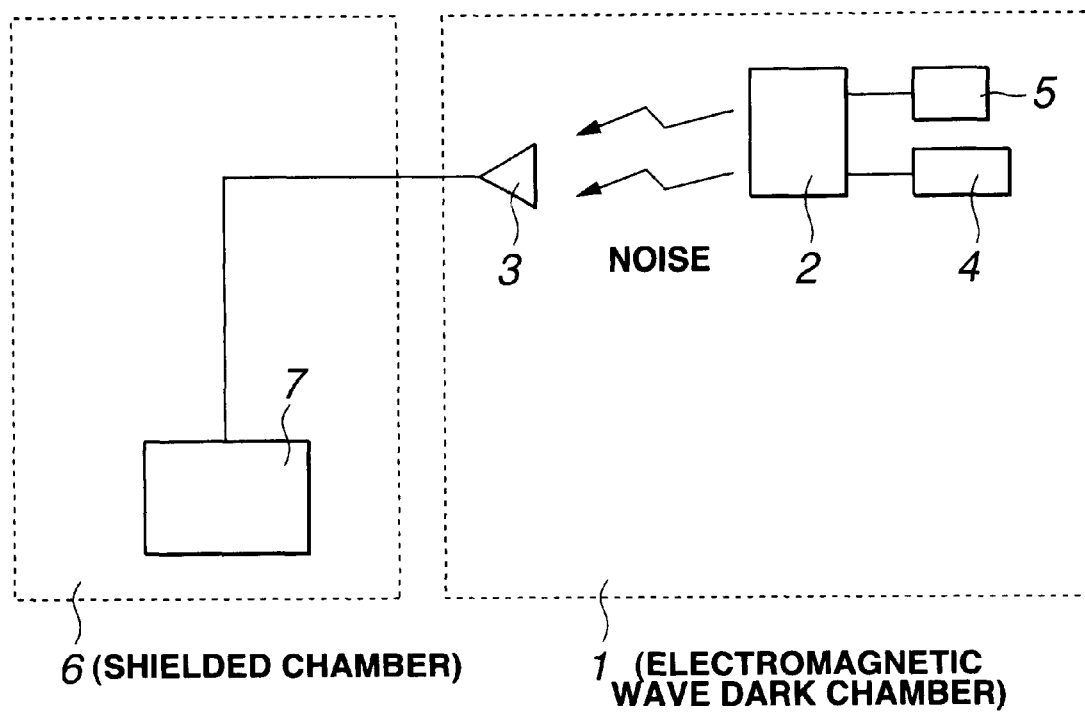
FIG. 1 is a block diagram showing a noise measuring test.

The electromagnetic wave absorbing, heat conductive silicone rubber composition of the invention is reached by incorporating a soft magnetic metal powder in a silicone rubber composition such that the composition in the cured state has a thermal conductivity of at least 2.0 w/mK. In a preferred embodiment, the composition further contains a heat conductive filler. The silicone rubber composition used herein is not critical as long as the cured product exhibits rubber elasticity. In this sense, silicone gel compositions are embraced.

The soft magnetic metal powder used herein is preferably iron or iron alloys. Illustrative examples of the iron alloy include Fe—Ni (commonly named permalloy), Fe—Co, Fe—Cr, Fe—Si, Fe—Al, Fe—Cr—Si, Fe—Cr—Al and Fe—Al—Si alloys. The soft magnetic metal powder may be of one type or a mixture of two or more types. The soft magnetic metal powder may be either of flat or round shape although the flat shape is preferred because of a greater surface area. On use of soft magnetic metal particles of flat shape which tend to account for a smaller volume proportion upon loading, soft magnetic metal particles of round shape may be used together.

Flat shape particles preferably have an average length of about 0.1 to 350 μm, especially about 0.5 to 100 μm and an aspect ratio (length/breadth) between about 5 and about 20. Round shape particles preferably have a mean particle diameter of about 0.1 to 50 μm, especially about 0.5 to 20 μm.

In a preferred embodiment, the soft magnetic metal powder is blended in an amount to account for 5 to 80%, especially 20 to 75% by volume of the entire composition. Less than 5% by volume of the metal powder may fail to impart an ability to absorb electromagnetic waves whereas more than 80% by volume may achieve no further improvement in electromagnetic wave absorption and result in a cured product with an increased hardness. More preferably, the soft magnetic metal powder is blended in such amounts that the resulting silicone rubber composition may be cured into a part capable of achieving a noise attenuation of more than about 5 dB, especially more than about 10 dB, when used with electronic equipment components.

The silicone rubber composition having the soft magnetic metal powder blended therein is heat conductive in itself. In order that the composition acquire a better heat transfer or dissipation capability, a heat conductive filler is preferably used in combination with the soft magnetic metal powder.

The heat conductive filler used herein is typically selected from nonmagnetic metals such as copper and aluminum, metal oxides such as alumina, silica, magnesia, red iron oxide, berylia, and titania, metal nitrides such as aluminum nitride, silicon nitride and boron nitride, and silicon carbide.

The heat conductive filler may be of one type or a mixture of two or more types.

Preferably the heat conductive filler has a mean particle diameter of about 0.1 to about 50 μm, especially about 0.5 to about 20 μm.

The heat conductive filler is used for the purposes of achieving closer packing with the soft magnetic metal powder and increasing the thermal conductivity of the composition. The amount of the heat conductive filler is preferably 85 to 10%, especially 70 to 20% by volume of the entire composition. The amount of the soft magnetic metal powder and the heat conductive filler combined is preferably 15 to 90%, especially 30 to 85% by volume of the entire composition. If the amount of the soft magnetic metal powder and the heat conductive filler combined exceeds 90 vol %, the composition may become too viscous to mold into parts like heat dissipating sheets, with the additional result that cured parts have too high rubber hardness. If such a viscous composition is dissolved in an organic solvent such as toluene and xylene to form a solution, heat dissipating sheets and other parts can be formed therefrom by a coating technique. However, the molded parts may have an increased contact thermal resistance due to increased surface roughness and hence, an insufficient heat transfer ability. If the amount of the soft magnetic metal powder and the heat conductive filler combined is less than 15 vol %, little improvement in thermal conductivity is made.

In the cured state, the electromagnetic wave absorbing, heat conductive silicone rubber composition should have a thermal conductivity of at least 2.0 w/mK, preferably at least 3.0 w/mK, and most preferably at least 4.0 w/mK.

The silicone rubber compositions which can be used herein include silicone gel compositions, addition reaction type silicone rubber compositions, and peroxide vulcanization type silicone rubber compositions. It is recommended to use, among others, silicone rubber compositions of the low hardness type and silicone gel compositions because a lower rubber hardness in the cured state is preferred for improving the close contact with electronic equipment components or heat sinks and reducing the contact thermal resistance at the interface.

In the cured state, the electromagnetic wave absorbing, heat conductive silicone rubber composition should preferably have a hardness of up to 80, especially up to 50 in Asker C hardness for improving the physical contact thereof with electronic equipment components and heat sinks for more effective noise attenuation and heat dissipation.

In the silicone rubber or gel compositions, the base polymer may be a conventional organopolysiloxane, preferably of the following average compositional formula (1).

(1)

Herein, $R^1$ is independently a substituted or unsubstituted monovalent hydrocarbon radical, and n is a positive number from 1.98 to 2.02.

In formula (1), $R^1$, which may be the same or different, stands for substituted or unsubstituted monovalent hydrocarbon radicals, preferably having 1 to 10 carbon atoms, more preferably 1 to 8 carbon atoms, for example, unsubstituted monovalent hydrocarbon radicals including alkyl radicals such as methyl, ethyl, propyl, isopropyl, butyl, isobutyl, tert-butyl, hexyl and octyl; cycloalkyl radicals such as cyclohexyl; alkenyl radicals such as vinyl and allyl; aryl radicals such as phenyl and tolyl; aralkyl radicals such as benzyl, phenylethyl and phenylpropyl; and substituted monovalent hydrocarbon radicals including the foregoing radicals in which some or all of the hydrogen atoms attached to carbon atoms are substituted with halogen atoms, cyano and other groups, for example, halogenated alkyl radicals and cyano-substituted alkyl radicals such as chloromethyl, bromoethyl, trifluoropropyl and cyanoethyl. Of these, methyl, phenyl, vinyl and trifluoropropyl radicals are preferable. More preferably methyl accounts for at least 50 mol %, especially at least 80 mol % of the $R^1$ radicals. The letter n is a positive number from 1.98 to 2.02. Preferably the organopolysiloxane has at least two alkenyl radicals per molecule, especially with the alkenyl radicals accounting for 0.001 to 5 mol % of the $R^1$ radicals.

The organopolysiloxane of formula (1) may have any molecular structure and is preferably blocked at ends of its molecular chain with triorganosilyl radicals or the like, especially diorganovinylsilyl radicals such as dimethylvinylsilyl. In most cases, the organopolysiloxane is preferably a linear one although a mixture of two or more different molecular structures is acceptable.

The organopolysiloxane preferably has an average degree of polymerization of 100 to 100,000, especially 100 to 2,000, and a viscosity of 100 to 100,000,000 centistokes at 25° C., especially 100 to 100,000 centistokes at 25° C.

When the above silicone rubber composition is formulated to the addition reaction type, the organopolysiloxane is one having at least two alkenyl radicals such as vinyl radicals per molecule, and the curing agent is a combination of an organohydrogenpolysiloxane and an addition reaction catalyst.

The organohydrogenpolysiloxane is preferably of the following average compositional formula (2):

(2)

wherein $R^2$ is a substituted or unsubstituted monovalent hydrocarbon radical of 1 to 10 carbon atoms, the subscript "a" is a number from 0 to 3, especially from 0.7 to 2.1, and b is a number from more than 0 to 3, especially from 0.001 to 1, satisfying 0<a+b ≦3, especially 0.8≦a+b≦3.0. This organohydrogenpolysiloxane is liquid at room temperature.

In formula (2), $R^2$ stands for substituted or unsubstituted monovalent hydrocarbon radicals of 1 to 10 carbon atoms, especially 1 to 8 carbon atoms, examples of which are the same as exemplified above for $R^1$, preferably those free of aliphatic unsaturation, and include alkyl, aryl, aralkyl and substituted alkyl radicals, such as methyl, ethyl, propyl, phenyl, and 3,3,3-trifluoropropyl among others. The molecular structure may be straight, branched, cyclic or three-dimensional network. The SiH radicals may be positioned at an end or intermediate of the molecular chain or both. The molecular weight is not critical although the viscosity is preferably in the range of 1 to 1,000 centistokes at 25° C., especially 3 to 500 centistokes at 25° C.

Illustrative, non-limiting, examples of the organohydrogenpolysiloxane include 1,1,3,3-tetramethyldisiloxane, methylhydrogen cyclic polysiloxane, methylhydrogensiloxane/dimethylsiloxane cyclic copolymers, both end trimethylsiloxy-blocked methylhydrogenpolysiloxane, both end trimethylsiloxy-blocked dimethylsiloxane/methylhydrogensiloxane copolymers, both end dimethylhydrogensiloxy-blocked dimethylpolysiloxane, both end dimethyl-hydrogensiloxy-blocked dimethylsiloxane/methylhydrogensiloxane copolymers, both end trimethylsiloxy-blocked methylhydrogensiloxane/diphenylsiloxane copolymers, both end trimethylsiloxy-blocked methylhydrogensiloxane/diphenylsiloxane/dimethylsiloxane copolymers, copolymers comprising $(CH_3)_2HSiO_{1/2}$ units and $SiO_{4/2}$ units, copolymers comprising (CH$_3$)$_2$HSiO$_{1/2}$ units, (CH$_3$)$_3$SiO$_{1/2}$ units and SiO$_{4/2}$ units, and copolymers comprising (CH$_3$)$_2$HSiO$_{1/2}$ units, SiO$_{4/2}$ units and (C$_6$H$_5$)$_3$SiO$_{1/2}$.

The organohydrogenpolysiloxane is preferably blended in the base polymer in such amounts that the ratio of the number of silicon atom-attached hydrogen atoms (i.e., SiH radicals) on the organohydrogenpolysiloxane to the number of silicon atom-attached alkenyl groups on the base polymer may range from 0.1:1 to 3:1, more preferably from 0.2:1 to 2:1.

The addition reaction catalyst used herein is typically a platinum group metal catalyst. Use may be made of platinum group metals in elemental form, and compounds and complexes containing platinum group metals as the catalytic metal. Illustrative examples include platinum catalysts such as platinum black, platinic chloride, chloroplatinic acid, reaction products of chloroplatinic acid with monohydric alcohols, complexes of chloroplatinic acid with olefins, and platinum bisacetoacetate; palladium catalysts such as tetrakis(triphenylphosphine)palladium and dichlorobis (triphenylphosphine)palladium; and rhodium catalysts such as chlorotris(triphenylphosphine)rhodium and tetrakis (triphenylphosphine)rhodium. The addition reaction catalyst may be used in a catalytic amount, which is often about 0.1 to 1,000 ppm, more preferably about 1 to 200 ppm of platinum group metal, based on the weight of the alkenyl radical-containing organopolysiloxane. Less than 0.1 ppm of the catalyst may be insufficient for the composition to cure whereas more than 1,000 ppm of the catalyst is often uneconomical.

In the practice of the invention, silicone rubber compositions of the addition reaction curing type as mentioned above are preferred because they tend to cure to a lower hardness.

In the other embodiment wherein the silicone rubber composition is of the peroxide curing type, organic peroxides are used as the curing agent. The organic peroxide curing is useful when the organopolysiloxane as the base polymer is a gum having a degree of polymerization of at least 3,000. The organic peroxides used may be conventional well-known ones, for example, benzoyl peroxide, 2,4-dichlorobenzoyl peroxide, p-methylbenzoyl peroxide, o-methylbenzoyl peroxide, 2,4-dicumyl peroxide, 2,5-dimethyl-bis(2,5-t-butylperoxy)hexane, di-t-butyl peroxide, t-butyl perbenzoate, 1,1-bis(t-butylperoxy)-3,3,5-trimethylcyclohexane, and 1,6-bis(t-butylperoxycarboxy)-hexane.

An appropriate amount of the organic peroxide blended is about 0.01 to 10 parts by weight per 100 parts by weight of the organopolysiloxane as the base polymer.

In addition to the above-described components, the silicone rubber composition may further contain conventional additives. Also, for the purpose of increasing the amounts of the soft magnetic metal powder and heat conductive filler loaded, there may be preferably used wetters capable of improving the wetting or dispersion of the soft magnetic metal powder and heat conductive filler with the base polymer. Exemplary wetters are silanes and low molecular weight siloxanes having hydrolyzable radicals such as hydroxyl and alkoxy radicals, especially methylpolysiloxane containing a trifunctional hydrolyzable radical at one end.

Any conventional methods are employable for preparing and curing the electromagnetic wave absorbing, heat conductive silicone rubber composition according to the invention.

On use, the electromagnetic wave absorbing, heat conductive silicone rubber composition is molded and cured into a sheet. The sheet is typically disposed between an electronic equipment component and a heat sink for thereby suppressing noise generated from the electronic component due to its improved electromagnetic wave absorbing capability and promoting heat transfer from the electronic component to the heat sink due to its improved heat dissipating capability. Since the soft magnetic metal powder is unlikely to rust, the composition has the additional advantages of reliability and long-term storage and service.

EXAMPLE

Examples of the invention are given below by way of illustration and not by way of limitation.

Examples 1–15 & Comparative Examples 1–2

Cured parts of silicone rubber containing soft magnetic metal powder and heat conductive filler were prepared as follows. To 100 parts by weight of a vinyl-containing dimethylpolysiloxane blocked at either end with a dimethylvinylsiloxy radical and having a viscosity of 3000 Pa·s at room temperature, which was selected to give a liquid composition of the addition reaction type, were added 5 to 70 parts by weight of a hydrolyzable radical-containing methylpolysiloxane of the formula shown below, and amounts of the soft magnetic metal powder and the heat conductive filler. The ingredients were agitated and mixed at room temperature. With agitation and mixing continued, the mixture was heat treated at 120° C. for one hour, obtaining a base compound.

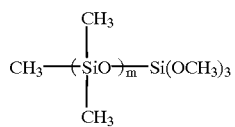

The letter m is an integer of 5 to 100.

The soft magnetic metal powders used were the iron and alloys shown in Table 1 (available from Daido Steel Co., Ltd.). The heat conductive fillers used were an alumina powder in the form of a mixture of AO-41R and AO-502 (Adomatecs Co., Ltd.), a silicon carbide powder GP#1000 (Shinano Electrosmelting Co., Ltd.), aluminum nitride UM (Toyo Aluminium Co., Ltd.) and aluminum AB-53E9 (Toyo Aluminium Co., Ltd.).

TABLE 1

| No. | Type | Shape | Diameter (μm) | Aspect ratio | Composition (wt %) |
|-----|------|-------|---------------|--------------|---------------------|
| 1 | Fe | flat | 25 | 12 | 100 |
| 2 | Fe—Ni | flat | 25 | 12 | 58/42 |
| 3 | Fe—Co | flat | 20 | 10 | 50/50 |
| 4 | Fe—Cr | round | 10 | — | 87/13 |
| 5 | Fe—Si | round | 8 | — | 97/3 |
| 6 | Fe—Cr—Si | round | 10 | — | 88/5/7 |
| 7 | Fe—Cr—Al | flat | 20 | 10 | 84/7/9 |
| 8 | Fe—Si—Al | flat | 10 | 10 | 85/10/5 |
| 9 | Fe—Al | flat | 10 | 10 | 84/16 |

Next, an organohydrogenpolysiloxane having at least two hydrogen atoms directly attached to silicon atoms per molecule, a platinum group metal catalyst, and an acetylene alcohol addition reaction regulating agent were added to the base compounds, followed by mixing. The compositions were press molded and heat cured at 120° C. for 10 minutes, obtaining sheets of 0.3 mm thick. The amount of organohydrogenpolysiloxane added was adjusted such that a stack of two sheets of 6 mm thick obtained by press molding while heat curing at 120° C. for 15 minutes exhibited a hardness of 30 to 60 as measured by an Asker C hardness meter (Kobunshi Keiki K.K.).

The sheets were examined for thermal conductivity and noise attenuation. The results are shown in Table 2.

The test method for examining a noise attenuation or noise suppressing effect is described below. FIG. 1 is a block diagram showing how to measure noise in the test. Disposed in an electromagnetic wave dark chamber 1 is a personal computer 2 in which a sheet (30 mm long, 30 mm wide, 0.3 mm thick) formed from the silicone composition is interposed between a CPU chip (operating frequency 300 MHz) and an aluminum heat sink. The PC 2 has connected thereto a display 4 and a keyboard 5. A receiver antenna 3 is located in the chamber and spaced 3 m from the PC 2. This setting complies with the 3-m testing according to the Federal Communications Commission (FCC). The antenna 3 is connected to an EMI receiver 7 in the form of a spectrum analyzer disposed in a shielded chamber 6. The PC 2 was started up, and the noise generated therefrom was measured by the EMI receiver 7 through the antenna 3. During the test, the display 4 connected to the PC 2 was turned off so that the display produced no noise.

thereto in light of the above teachings. It is therefore to be understood that the invention may be practiced otherwise than as specifically described without departing from the scope of the appended claims.

What is claimed is:

1. An electromagnetic wave absorbing, heat conductive silicone rubber composition comprising a soft magnetic metal powder and a heat conductive filler, and having in the cured state a thermal conductivity of at least 2.0 w/mK;

wherein said soft magnetic metal powder being at least one member selected from the group consisting of Fe, Fe—Ni, Fe—Co, Fe—Cr, Fe—Si, Fe—Al, Fe—Cr—Si, Fe—Cr—Al and Fe—Al—Si alloys; and said heat conductive filler being at least one member selected from the group consisting of copper, aluminum, alumina, silica, magnesia, red iron oxide, berylia, titania, aluminum nitride, silicon nitride, boron nitride and silicon carbide.

2. The electromagnetic wave absorbing, heat conductive silicone rubber composition of claim 1, wherein said soft magnetic metal powder is 5 to 80% by volume of said composition.

3. The electromagnetic wave absorbing, heat conductive silicone rubber composition of claim 1, comprising 5 to 80% by volume of said soft magnetic metal powder and 85 to

TABLE 2

| | | Soft magnetic metal powder | | Heat conductive filler | | Thermal conductivity (w/mK) | Noise attenuation[1] (dB) |
|---|---|---|---|---|---|---|---|
| | | Type | Content (vol %) | Type | Content (vol %) | | |
| Example | 1 | Fe—Cr | 60 | — | — | 2.1 | −13.8 |
| | 2 | Fe | 30 | alumina | 40 | 4.1 | −11.7 |
| | 3 | Fe—Ni | 28 | alumina | 45 | 4.5 | −12.1 |
| | 4 | Fe—Co | 30 | alumina | 40 | 4.2 | −10.4 |
| | 5 | Fe—Cr | 25 | alumina | 60 | 15 | −9.5 |
| | 6 | Fe—Si | 30 | alumina | 40 | 4.0 | −7.8 |
| | 7 | Fe—Cr—Si | 30 | alumina | 40 | 4.2 | −11.9 |
| | 8 | Fe—Cr—Al | 30 | alumina | 40 | 4.3 | −10.7 |
| | 9 | Fe—Cr | 10 | alumina | 70 | 9.0 | −3.0 |
| | 10 | Fe—Cr | 70 | alumina | 10 | 9.5 | −14.1 |
| | 11 | Fe—Cr | 30 | silicon carbide | 40 | 4.6 | −12.2 |
| | 12 | Fe—Cr | 30 | aluminum nitride | 40 | 4.8 | −12.0 |
| | 13 | Fe—Cr | 30 | aluminum | 40 | 5.2 | −12.8 |
| | 14 | Fe—Si—Al | 30 | alumina | 40 | 4.1 | −11.5 |
| | 15 | Fe—Al | 30 | alumina | 40 | 4.2 | −8.3 |
| Comparative Example | 1 | — | — | alumina | 70 | 3.0 | −0.0 |
| | 2 | Ni—Zn (ferrite) | 30 | alumina | 40 | 3.9 | −4.5 |

[1]Noise attenuation: an attenuation (dB) at frequency 1,000 MHz

As is evident from Table 2, the loading of heat conductive filler alone fails to achieve noise attenuation, the loading of soft magnetic metal powder alone achieves noise attenuation, and the combined use of soft magnetic metal powder and heat conductive filler provides a higher thermal conductivity while maintaining noise attenuation.

There has been described an electromagnetic wave absorbing, heat conductive silicone rubber composition suitable for forming heat dissipating sheets having both a heat transfer function and a noise attenuation function, which are effective for preventing malfunction of CPU.

Japanese Patent Application No. 2000-109249 is incorporated herein by reference.

Although some preferred embodiments have been described, many modifications and variations may be made 10% by volume of said heat conductive filler, the amount of said soft magnetic metal powder and said heat conductive filler combined being 15 to 90% by volume based on the composition.

4. The composition of claim 1 for use with electronic equipment components.

5. The electromagnetic wave absorbing, heat conductive silicone rubber composition of claim 1, wherein said soft magnetic metal powder has flat shape particles.

6. The electromagnetic wave absorbing, heat conductive silicone rubber composition of claim 1, wherein said flat shape particles have an aspect ratio of about 5 to about 20.

7. The electromagnetic wave absorbing, heat conductive silicone rubber composition of claim 1, wherein said soft magnetic metal powder has round shape particles.

8. The electromagnetic wave absorbing, heat conductive silicone rubber composition of claim 7, wherein said round shape particles have a mean particle diameter of about 0.1 to about 50 μm.

9. The electromagnetic wave absorbing, heat conductive silicone rubber composition of claim 2, wherein said soft magnetic metal powder is 20 to 75% by volume of said composition.

10. The electromagnetic wave absorbing, heat conductive silicone rubber composition of claim 1, wherein said heat conductive filler has a mean particle diameter of about 0.1 to about 50 μm.

11. The electromagnetic wave absorbing, heat conductive silicone rubber composition of claim 1, wherein said silicone rubber composition has a organopolysiloxane as the base polymer having a formula (1):

$$R^1_n SiO_{(4-n)/2} \qquad (1)$$

wherein $R^1$ is independently a substituted or unsubstituted monovalent hydrocarbon radical, and n is a positive number from 1.98 to 2.02.

12. A heat dissipating sheet comprising the electromagnetic wave absorbing, heat conductive silicone rubber composition of claim 1.

13. A heat dissipating sheet comprising the electromagnetic wave absorbing, heat conductive silicone rubber composition of claim 3.

14. A method of producing a heat dissipating sheet, said method comprising:

molding and curing an electromagnetic wave absorbing, heat conductive silicone rubber composition into said sheet, wherein said composition comprises a soft magnetic metal powder and a heat conductive filler, and having in the cured state a thermal conductivity of at least 2.0 w/mK, wherein said soft magnetic metal powder being at least one member selected from the group consisting of Fe, Fe—Ni, Fe—Co, Fe—Cr, Fe—Si, Fe—Al, Fe—Cr—Si, Fe—Cr—Al and Fe—Al—Si alloys, and said heat conductive filler being at least one member selected from the group consisting of copper, aluminum, alumina, silica, magnesia, red iron oxide, berylia, titania, aluminum nitride, silicon nitride, boron nitride and silicon carbide.

* * * * *